United States Patent [19]

Shiga et al.

[11] Patent Number: 5,087,604
[45] Date of Patent: Feb. 11, 1992

[54] METHOD OF MANUFACTURING A SUPERCONDUCTOR

[75] Inventors: Shoji Shiga, Utsunomiya; Naoki Uno, Yokohama; Yasuzo Tanaka, Yokohama; Hiroyuki Kikuchi, Yokohama; Kaisuke Shiroyama, Zama, all of Japan

[73] Assignee: The Furukawa Electric Co., Ltd., Tokyo, Japan

[21] Appl. No.: 492,292

[22] Filed: Feb. 28, 1990

Related U.S. Application Data

[63] Continuation of Ser. No. 232,493, Aug. 15, 1988, abandoned.

[30] Foreign Application Priority Data

Sep. 4, 1987 [JP] Japan .................................. 62-221304

[51] Int. Cl.$^5$ .................................................. H01L 39/24
[52] U.S. Cl. ........................................... 505/1; 29/599; 264/82
[58] Field of Search ...................... 29/412, 417, 599; 505/1, 705; 264/82

[56] References Cited

U.S. PATENT DOCUMENTS

| | | | |
|---|---|---|---|
| 3,714,706 | 2/1973 | Reizman et al. | 29/417 X |
| 4,148,129 | 4/1979 | Young | 29/599 |
| 4,251,477 | 2/1981 | Christian | 264/82 |
| 4,336,420 | 6/1982 | Benz | 29/599 X |
| 4,469,655 | 9/1984 | Kiss | 264/82 |
| 4,640,816 | 2/1987 | Atzmon et al. | 29/599 X |

FOREIGN PATENT DOCUMENTS 0281444 9/1988 European Pat. Off. .
0281474 9/1988 European Pat. Off. .

OTHER PUBLICATIONS

"High Tc Superconductors-Composite Wire Fabrication" Jin et al., 5/1987.
Kohno et al., "Characteristics of High-Tc Oxide Wire" Dec. 1987, pp. 429-431, Physica B & C, vol. 14B+C, No. 1-3.
"Superconducting Wires of High Tc Oxides", Ohmatsu et al., *Japanese Journal of Applied Physics*, vol. 26, 1987.
"Critical Density of Wire Type Y-Ba-Cu Oxide Superconductor", Yamada et al., *Japanese Journal of Applied Physics*, May 1987.
"Fabrication of Dense $Ba_2YCu_3O_{7-d}$ Superconductor Wire by Molten Oxide Processing", Jin et al., *Applied Physics*, Jul. 30, 1987.

*Primary Examiner*—Joseph M. Gorski
*Attorney, Agent, or Firm*—Frishauf, Holtz, Goodman & Woodward

[57] ABSTRACT

A method of manufacturing a superconductor includes the steps of filling a ceramic superconductor or a material mixture thereof in a metal container, elongating the metal container, slitting the metal container by a predetermined width to partially expose a material inside the metal container, and sintering the material inside the metal container.

24 Claims, 4 Drawing Sheets

METHOD OF MANUFACTURING A SUPERCONDUCTOR

This application is a continuation of application Ser. No. 07/232,493, filed Aug. 15, 1988 and now abandoned.

BACKGROUND OF THE INVENTION

1. Field of the Invention

The present invention relates to a method of manufacturing a ceramic superconductor and, more particularly, to a method of manufacturing a compound superconductor such as an oxide superconductor with poor workability.

2. Description of the Related Art

Ceramic superconductors such as oxide superconductor having higher critical temperatures than those of alloys (e.g., NbTi, NbZr, and NbTiZr) and intermetallic compounds (e.g., $Nb_3Sn$, $Nb_3Al$, and $Nb_3(AlGe)$) industrially have received a great deal of attention. Typical ceramic superconductors are:

(1) $La_2CuO_4$ superconductors such as $(LaBa)_2CuO_4$ and $(LaSr)_2CuO_4$;

(2) $LnBa_2Cu_3O_y$ superconductors (wherein Ln represents rare earth elements excluding Ce and Tb);

(3) Bi-Sr-Ca-Cu-O superconductors such as $BiSrCaCu_2O_x$, $Bi_2Sr_2CaCu_2O_x$ ($x=8$), and $Bi_2Sr_2Ca_2Cu_3O_x$ ($x=10$); and (4) Tl-Ba-Ca-Cu-O superconductors such as $Tl_2Ba_2CaCu_2O_8$ and $Tl_2Ba_2Ca_2Cu_3O_{10}$.

Superconductors (1) have critical temperatures Tc of 30 to 50 K. Superconductors (2), (3), and (4) have higher critical temperatures Tc, especially those equal to or higher than a liquid nitrogen temperature. These are superconductors of Type 2 and have upper critical magnetic fields as high as 10 to 200 T. They are expected to be also used for magnets of high magnetic fields.

However, these materials have poor workability. It is very difficult to form the materials into wires and strips required for wires, cables, magnet coil conductors, and the like. An attempt has been made to deposit such a material on a wire or strip substrate by a Physical Vapor Deposition method such as vapor deposition or sputtering. However, this attempt has led to only poor productivity. An effective method has not yet been proposed so far.

Strong demand, therefore, has arisen for developing a technique for satisfying the following points in view of the background described above:

(1) To provide a method of manufacturing wires and strips prepared by effectively utilizing characteristics (Tc, Hc1, Hc2, etc.) inherent to ceramic superconductors;

(2) To provide a method of working a mechanically weak ceramic body into a long wire or strip having a desired shape;

(3) To obtain a superconductor through which a superconducting current flows to as high a critical current density (Jc) as possible;

(4) To stabilize the superconducting current in practice without causing a quenching phenomenon;

(5) To obtain a superconductor having practical mechanical strength and durability against deformation and strain;

(6) To obtain a superconductor which is not denatured by a reaction with moisture, gases and chemicals in outer atmosphere during fabrication, storage, and the service life of the superconductor built into equipment and to assure a long service life; and (7) To achieve the above purposes on industrial and economical basis.

SUMMARY OF THE INVENTION

The present invention has been made in consideration of the above situation, and has as its object to provide a method of efficienty manufacturing a ceramic superconductor having poor workability.

In order to achieve the above object of the present invention, there is provided a method of manufacturing a superconductor, comprising filling a ceramic superconductor or a material mixture thereof in a metal container, plastically deforming, for example, elongating and pressing the metal container, forming a slit in the tube to partially expose the material therein, and sintering the material. Elongation techniques include rolling, extrusion, drawing, wire drawing, and swaging. Among these elongation techniques, rolling is effective if it is combined with a slitter since the superconductor within the container can be effectively, precisely, densely, and uniformly deformed at a high pressure. Shear during rolling allows uniform formation of preferable cleavages (to be described later) inside the superconductor, thereby obtaining a high-performance superconductor.

It is also apparent that the $O_2$ reaction during sintering can be accelerated by obtaining a large number of superconductor bodies exposed at both ends during rolling or slitter operation.

According to the present invention, the particle size of the powder is reduced during elongation, and at the same time, particles of the powder are brought into tight contact with each other to obtain an excellent filling structure. As a result a superconductor having good superconducting characteristics such as high critical temperature Tc and high critical current density Jc can be obtained. In order to obtain such an effect sufficiently, a total deformation rate which is conveniently measured in terms of a real reduction is preferably 50% or more, and more preferably 75% to 99.999% or more.

DETAILED DESCRIPTION OF THE PREFERRED EMBODIMENTS

The present invention will be described in detail with reference to the accompanying drawings. The same reference numerals denote the same parts throughout the drawings. Powder 2 consisting of a ceramic superconductor or its material mixture is densely filled in metal container 1 having a rectangular cross section shown in FIG. 1A. An opening is sealed as needed. Tube 1 is rolled to predetermined thickness t, as shown in FIG. 1B. A slit having predetermined width w is formed in rolled tube 1 as shown in FIG. 1C and powder 2 is sintered. Therefore, a superconductor wire or strip consisting of metal 11 and superconductor 12, as shown in FIG. 1D, can be obtained.

A material for the metal container may be Cu, Cu alloys (e.g., Cu-Ni, Cu-Si, or Cu-Fe), Al, Al alloys, Ni, Fe, Co, Ni alloys, Fe alloys, Co alloys, stainless steel, W, Mo, Ag, Pt, Au, Pd, W alloys, Mo alloys, Ag alloys, Pt alloys, Au alloys, and Pd alloys. The material for the metal container may be a composite of a plurality of metals.

When it is difficult to machine a metal container due to accumulation of working strain, intermediate annealing may be performed during elongation to eliminate the working strain, and then elongation may be restarted. Finally, a slit is formed in the resultant body, thereby obtaining a wire or strip having an arbitrary thickness and an arbitrary width.

In addition, after the powder is filled in the metal container, deaeration is performed and the opening is sealed. In this case, expansion by heat during elongation and denaturation and expansion of the material by an internal gas during annealing can be prevented. It should be noted that a metal block having a plurality of hollow tube portions may be effectively used to start the process in place of the metal container shown in FIGS. 1A to 1D.

In each of the cross-sectional views of FIGS. 2A to 2D showing metal blocks used in the present invention, reference numeral 21 denotes hollow tube portions; 22, a connecting portion between the hollow tube portions; and 23, a tube wall portion. These metal blocks can be manufactured by extrusion, casting, powder metallurgy, welding, or roll bonding. After a superconductor is densely filled in each metal block, deaeration is performed and the opening is sealed.

Figure 3:
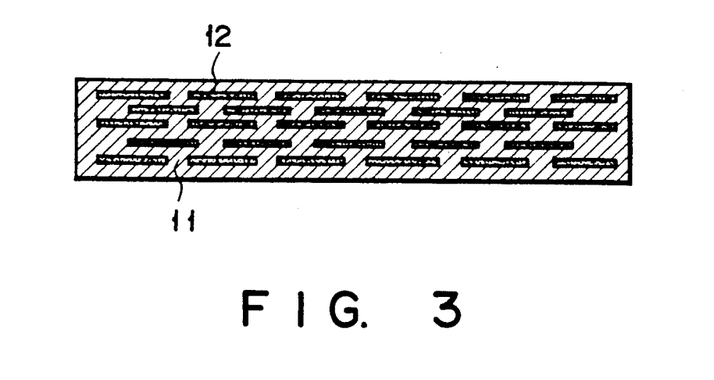
FIG. 3 is a sectional view of an elongated body according to a method of the present invention.

The resultant blocks filled with the superconductor are pressed. Pressing is performed by rolling, extrusion, drawing, forging or a combination thereof. Of these techniques, rolling is effective to efficiently roll a large block into a body having a small thickness. However, most preferably, extrusion or forging is performed as preliminary working, and elongation is performed. FIG. 3 is a sectional view of an elongated body.

During working, a plurality of semi-finished bodies may be further filled in a similar metal blocks or the like or are connected to each other, and working may be restarted to effectively obtain a large number of superconductor wires or strips.

Figure 4A:
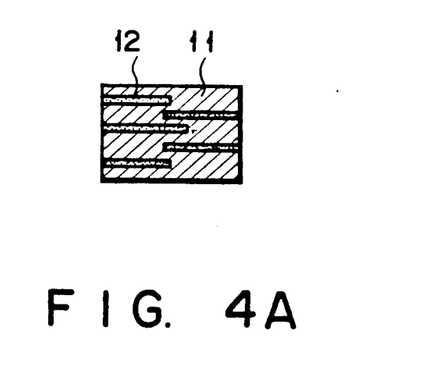
FIGS. 4A and 4B are sectional views of the body shown in FIG. 3.
Figure 4B:
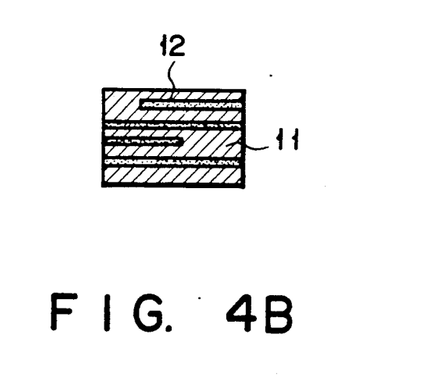

The slit of the rolled metal container may be formed with a laser or the like, as well as a slitter such as a conventional rotary blade, so that a wire or strip with at least of part of the powder within the metal container being exposed can be prepared, as shown in sectional views of FIGS. 1C, 4A and 4B. FIGS. 4A and 4B are sectional views of the slit of the body shown in FIG. 3.

The wire or strip with a slit is sintered in a desired atmosphere. An oxidation, reducing, or humid atmosphere may be selected as needed.

After sintering, any treatment is additionally performed as needed. For example, in an oxide superconductor, a crystal structure may be transformed at a temperature lower than the sintering temperature in the presence of oxygen.

The resultant wire or strip is covered with a conductor (e.g., a metal) or insulated by a polymer or the like. A large number of wires or strips are twisted to obtain a cable. The above treatments can be performed by extrusion, coating/baking, plating, spraying, or the like.

According to the present invention, the particle size of the powder consisting of the ceramic superconductor or its material mixture is reduced during elongation, so that the particles of the powder are brought into tight contact with each other to obtain a dense filling structure. At the same time, part of the working energy is accumulated inside the powder, and bonding between the particles and their reaction are accelerated during sintering. As a result, a superconductor having good superconducting characteristic such as high critical temperature Tc and critical current density Jc can be obtained. During elongation, cleavage and particle size reduction of the crystal particles occur, which accelerates a crystal orientation and increases critical current density Jc.

Powder 2 is sintered while part of powder 2 filled in metal container 1 is exposed from an end face through a slit. Therefore, a reaction between powder 2 and oxygen and moisture is sufficiently performed, and the resultant superconductor has good superconducting characteristics such as high critical temperature Tc. An effect of powder exposure at the end face is typical in a ceramic superconductor such as an oxide superconductor in which excess oxygen or a lack of oxygen (stoichiometry) during sintering is a decisive factor determining the superconducting characteristics and oxygen in an atmosphere has an important role. During sintering and subsequent heating, the amount of oxygen in the atmosphere must be optimally determined to obtain best superconducting characteristics. In addition, when a gas is produced during sintering of a material mixture, the gas can be discharged from the open end face.

An embodiment of maximizing the characteristics of the superconductor according to the present invention will be described below.

In the previous method, the powder or its sintered body is filled in the container. However, instead, an oriented crystal material is filled in the container. This material consists of a polycrystal or single crystal. In the oriented crystal material, the cleavage crystal plane is mostly oriented within a range of 50°, in particular, preferably within a range of 30° when an elongation direction of the container is defined as the center.

$YBa_2Cu_3O_y$ as a composite oxide of Cu, i.e. an oxide superconductor, will be taken as an example. If $y \geq 6.5$, then $YBa_2Cu_3O_y$ has an orthorhombic structure; and if $y = 6$ to 6.5, then $YBa_2Cu_3O_y$ has a tetragonal structure. In either case, the crystal structure is a layer structure aligned along the C-axis. A superconducting current flows along a Cu-O plane parallel to the ab planes. The ab planes have cleavage properties. According to actual measurements, the superconducting current can be flowed in a direction parallel to the ab planes with ease 10 to 100 times that in a direction perpendicular thereto. The same results as described above can be obtained for Tl oxides and Bi oxides.

When a crystal material whose ab cleavage planes are oriented along the elongation direction is filled in a metal container beforehand, and the above treatments are performed a more oriented superconductor wire having a higher Jc can be obtained.

The oriented polycrystal used in the method of the present invention can be obtained by one-directional solidification, hot-forging, or aggregating a powder under a strong magnetic field and sintering the aggregate. The above treatments are effective after the material is filled in the metal container but before elongation is performed. One-directional solidification can be performed during or after elongation.

According to another embodiment of the present invention, a material which is to be filled in the metal container is heated and elongated. This operation is performed during part of the operation, particularly, in an initial stage of the operation. In this case, the heating temperature falls within the range of the melting point of the superconductor to a temperature below it by 300° C. This elongation is performed by hot forging, hot rolling, hot extrusion, or the like. Therefore, the crystal can be oriented as described above.

The excellent industrial applicability and effect of the features of the method of the present invention will be described in more detail. According to the present invention, part of the superconductor is exposed, and the material is sintered and heated, thereby maximally utilizing oxygen as an indispensable element for an oxide superconductor. If $Y \geq 6.8$ in $YBa_2CuO_y$, critical temperature Tc can be 90 K or more. For this reason, according to a conventional method, Ag having $O_2$ permeability must be used. However, Ag is expensive as a noble metal, and has a low mechanical strength and a low melting point. To the contrary, according to the present invention, a stronger base metal or its alloy can be used. For example, Cu alloys (e.g., Cu-Ni), Fe alloys (e.g., SUS), Ni alloys (Fe-Ni), Ta, or Mo can be used. When the oxidation reaction poses a problem, Ag, Pt, Pd, Au, or their alloys may be used to form a barrier layer. In addition to the above advantages, essential technical advantages can be obtained since Ag need not be used. More specifically, thermal expansion of the superconductor can be matched with that of the metal portion. A Y compound is taken as an example. Ag has a coefficient of thermal expansion twice that of the superconductor. When the metal and superconductor are sintered and cooled, a large thermal stress acts on them, and the mechanically weak superconductor is cracked. According to the present invention, use of a metal container allows working techniques developed in metallurgy and allows mechanical reinforcement of the superconductor. Also the metal container apparently provides an effect for shielding the superconductor from the outer atmosphere.

EXAMPLE 1

Figure 5A:
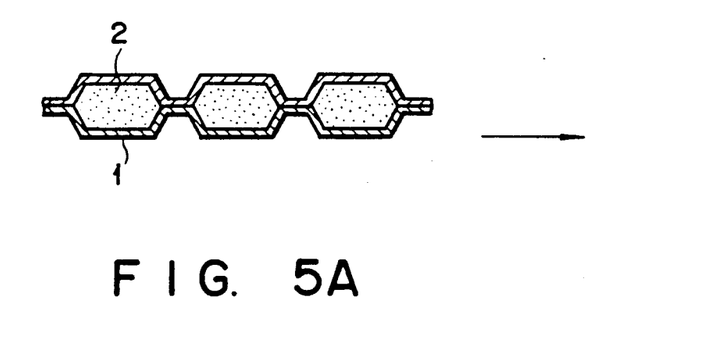
FIGS. 5A, 5B, and 5C are sectional views of another embodiment according to the present invention.
Figure 5B:
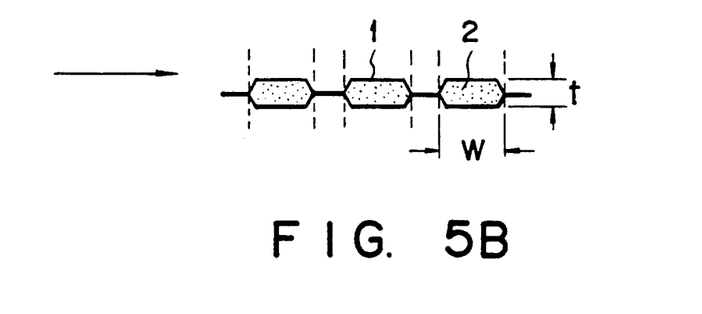
Figure 5C:
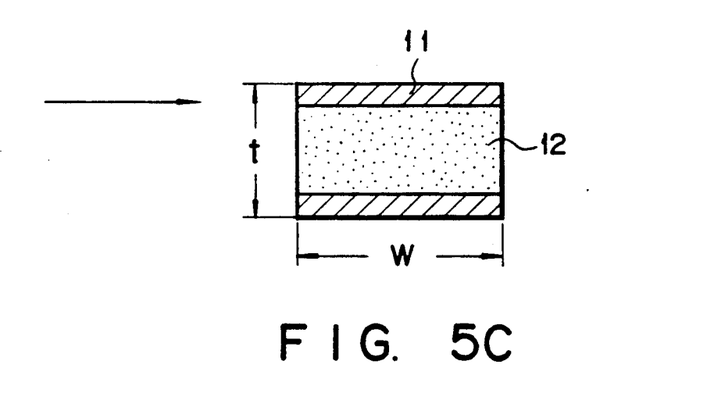

The present invention will be described in detail by way of its examples. A powder (average particle size: 16 µm) of $DyBa_2Cu_3O_7-\delta$ was filled in metal container 1 prepared by roll bonding and having a shape in FIG. 5A (Cu-20%Ni alloy container with 15-µ thick Ag plated layer on the inner surface; thickness of metal wall: 0.75 mm; thickness of container portion: 4.5 mm; width of container portion: 15 mm) with a packing rate of about 60%, deaeration was performed, and an opening was sealed. The container was rolled to a thickness of 2.3 mm and was annealed at 550° C. for 30 minutes. The container was further rolled to a thickness of 1.5 mm (total areal reduction: 67%). The resultant structure was slit (FIG. 5B) to obtain a strip having a thickness (t) of 1.5 mm and a width (W) of 5 mm. The strip was sintered in air at 910° C. for half an hour. The sintered strip (FIG. 5C) was heated in air at 810° C. for 6 hours and was cooled at a rate of 1° C./min. The thicknesses of metal wall were 0.46 mm and 0.28 mm when the thicknesses of tube portions were set to be 2.3 mm and 1.5 mm.

EXAMPLE 2

A rolled material having a container portion thickness of 1.0 mm as in Example 1 was annealed again at 550° C. for 30 minutes and was rolled to a thickness of 0.9 mm (total areal reduction 89%). The resultant sample was slit to obtain a strip, following the same procedures as in Example 1. The thickness of the metal wall was 0.08 mm when the thickness of the container portion was set to be 0.5 mm.

COMPARATIVE EXAMPLE 1

A container (total areal reduction: 31%) rolled to a container portion thickness of 3.2 mm was slit, and sintering and heating were performed following the same procedures as in Example 1.

COMPARATIVE EXAMPLE 2

A container was rolled to a container portion thickness of 1.5 mm as in Example 1 and was not slit. Sintering and heating were performed following the sam procedures as in Example 1.

COMPARATIVE EXAMPLE 3

A container was rolled to a container portion thickness of 0.5 mm as in Example 2 and was not slit. Sintering and heating were performed following the same procedures as in Example 2.

Critical temperatures Tc and critical current densities Jc (at 77 K) of the resultant superconductor samples in Examples 1 and 2 and Comparative Examples 1 to 3 were measured according to conventional techniques. Results are summarized in Table 1.

TABLE 1

|  | Areal reduction (%) | Tc (K) | Jc (A/cm$^2$) |
| --- | --- | --- | --- |
| Example 1 | 67 | 91 | 290 |
| Example 2 | 89 | 92 | 2300 |
| Comparative Example 1 | 31 | 89 | 59 |
| Comparative Example 2 | 67 | 4.2 or less | 0 |
| Comparative Example 3 | 89 | 4.2 or less | 0 |

As is apparent from Table 1, the samples in Examples 1 and 2 manufactured by the method of the present invention have good superconducting characteristics such as Tc and Jc. In particular, the sample having a higher areal reduction in Example 2 has excellent characteristics. The sample (Comparative Example 1) having a lower areal reduction than that of the sample of Example 1 has poor superconducting characteristics, in particular, Jc. In the samples (Comparative Examples 2 and 3) prepared by sintering without exposing the powder, they did not exhibit superconducting properties at temperatures of 4.2 K or more. This is estimated to be attributable to a lack of oxygen.

EXAMPLE 3

Figure 1A:
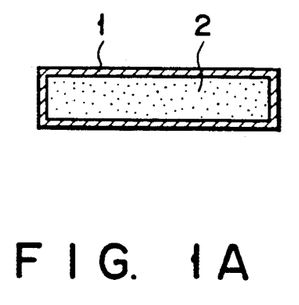
FIGS. 1A, 1B, 1C, and 1D are sectional views showing an embodiment of the present invention.
Figure 1B:
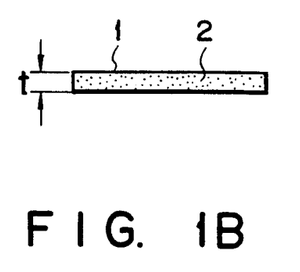
Figure 1C:
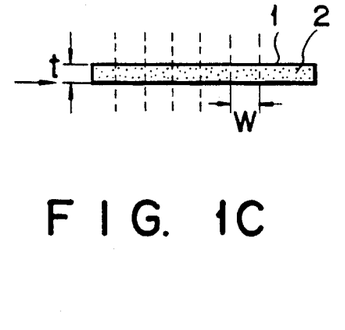
Figure 1D:
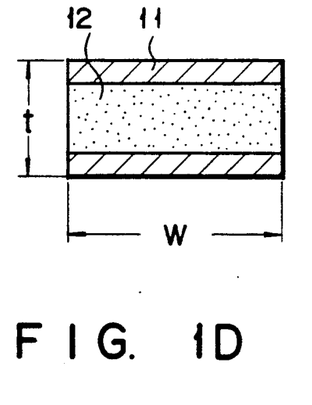
Figure 2A:
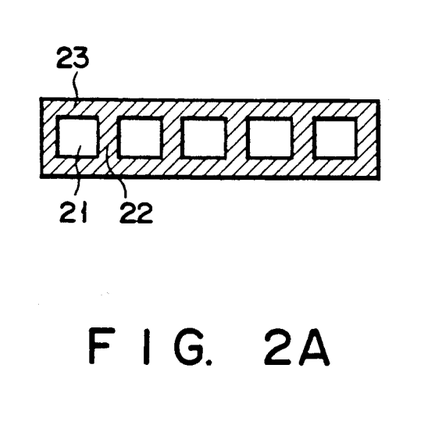
FIGS. 2A, 2B, 2C, and 2D are sectional views showing metal blocks used in the present invention.
Figure 2B:
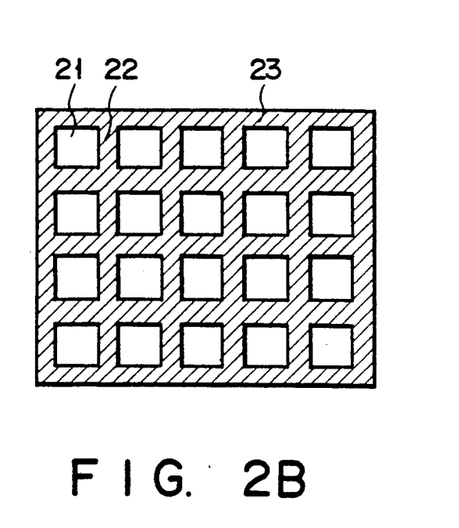
Figure 2C:
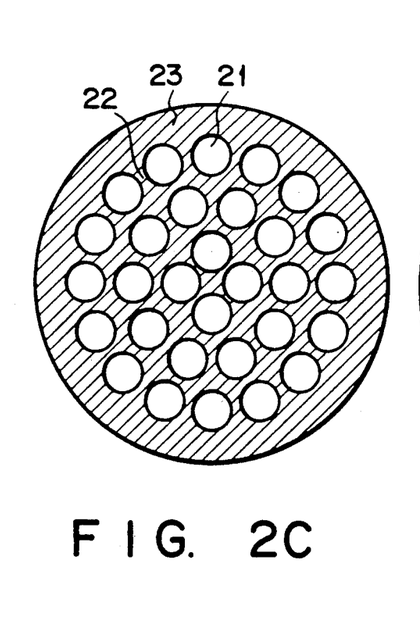
Figure 2D:
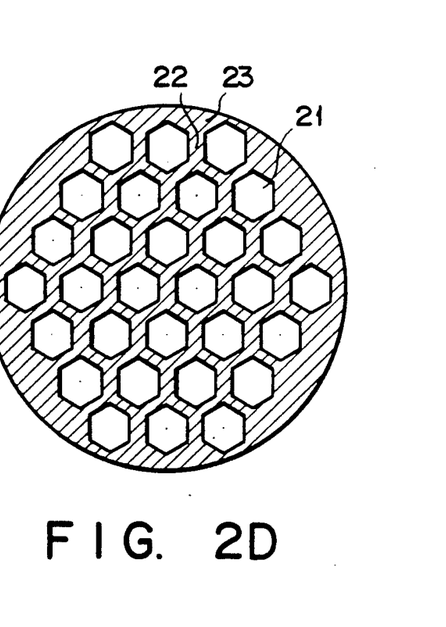

A one-direction solidified material $D_yBa_{2.1}Cu_{3.2}O_{6.9}$ (4.5×23 mm) was inserted in metal container 1 having a shape shown in FIG. 1A (SUS310 tube with a 30-µ thick Ag plated-layer formed on the inner surface; thickness of metal wall: 1.0 mm; thickness of container portion: 6 mm; width of container portion: 25 mm). Deaeration of the container was performed, and an opening was sealed. The container was rolled to a container portion thickness of 1.5 mm and annealed at 550° C. for 30 minutes. The container portion was rolled to a container portion thickness of 0.3 mm (total areal reduction: 95%). The resultant structure was slit to prepare a strip sample having a thickness of 0.3 mm and a width of 5 mm. The sample was sintered in air at 850° C. for 3 hours and then heated in air at 650° C. for 4 hours. The one-direction solidified material used in Example 3 was prepared such that the sintered body of $D_yBa_{2.1}Cu_{3.2}O_y$ powder mixture was heated to 1,190° C. in a Pt boat and moved at a speed of 10 mm/hour with a temperature gradient of 50° C./cm, and solidifying and cooling were performed in an $O_2$ flow. Crystal orientation degree in term of $\Sigma(00l)/\Sigma(nml)$ was measured as 93% by X-ray diffraction of a flat surface.

COMPARATIVE EXAMPLE 4

A container rolled to a container portion thickness of 0.3 mm was prepared following the same procedures as in Example 3 except that an Ag container was used as metal container. The container was not slit and sintering and heating were performed following the same procedures as in Example 3.

Critical temperatures Tc and critical current densities Jc (at 77 K) of superconductor samples of Example 3 and Comparative Example 4 were measured according to conventional techniques.

Results are summarized in Table 2.

TABLE 2

|  | Areal reduction (%) | Tc (K) | Jc (A/cm$^2$) |
| --- | --- | --- | --- |
| Example 3 | 95 | 93 | 19,300 |
| Comparative Example 4 | 95 | 882 | 150 |

As is apparent from Table 2, the sample of Example 3 manufactured according to the method of the present invention has better superconducting characteristics such as Tc and Jc than those of Examples 1 and 2. However, the sample (Comparative Example 4) obtained by sintering the container without slitting it to expose the powder has very poor characteristics, i.e., both Tc and Jc, as compared with the sample of Example 3.

EXAMPLE 4

A powder (average particle size: 5.2 $\mu$) of $D_yBa_{2.1}Cu_{3.2}O_{6.9}$ was pressed and was sintered at 880° C. for 2 hours. This sintered body (density: 80%) was analyzed according to X-ray diffraction in the same manner as in Example 3, and a diffraction intensity of the sintered body was $\Sigma(00l)/\Sigma(n,m,l) = 18\%$. Its orientation was random. The sintered body was sealed in a container as in Example 3 and pressed at 830° C. at a pressure of 1 ton/cm$^2$ for 3 hours. The container portion thickness was decreased to 4.3 mm. Part of the pressed body was analyzed according to X-ray diffraction, and its diffraction intensity was $\Sigma(00l)/\Sigma(n,m,l) = 58\%$, thus exhibiting a high orientation level although it is lower than that of Example 3.

A slit strip sample was prepared following the same procedures as in Example 3. Critical temperature Tc and critical current density Jc of the sample were 93 K and 7,800 A/cm$^2$, respectively.

EXAMPLE 5

A sintered body (density: 76%) of a $YBa_{2.2}Cu_{3.2}O_{6.85}$ powder (average particle size: 16 $\mu$m) was filled in a block obtained by forming nine hollow portions (diameter: 10.5 mm) in a Cu2ONi cylinder (outer diameter: 50 mm) and a 0.05-mm thick Pd30Ag film on the inner surface of the block. Deaeration of the block was performed, and an opening was sealed. The resultant block was heated to 770° C. and hydrostatically extruded to obtain a rod having a diameter of 20 mm. The rod was annealed in air at 550° C. for 15 minutes, was drawn as a rod having a diameter of 10 mm and was annealed again. This rod was slit at a pitch of 1.5 mm after the rod had been rolled to a thickness of 1 mm and a width of 20 mm by a turk's head roll while being annealed as mentioned above (total areal reduction: 99%). The sample was sintered in an oxygen flow at 910° C. for 10 hours and then gradually cooled at a rate of about 5° C./min.

EXAMPLE 6

A 10-mm diameter rod as in Example 5 was heated to 1,050° C. While one end of this rod outside a furnace was cooled by liquid nitrogen, the rod was moved at a speed of 50 mm/hour with a temperature gradient of 50° C./mm, thereby heating and cooling the rod.

EXAMPLE 7

A sample was prepared following the same procedures as in Example 6 except that a slit strand was used.

EXAMPLE 8

A 10-mm diameter rod was filled again in a Cu2ONi cylinder used in Example 5, and a sample was prepared following the same procedures as in Example 5.

EXAMPLE 9

A sample was prepared following the same procedures as in Example 8 except that rod heat-treated as in Example 6 was used as a 10-mm diameter rod.

COMPARATIVE EXAMPLES 5-9

Samples were prepared following the same sintering procedures as in Examples 5 to 9 except that slits were not formed.

Critical temperatures Tc and critical current densities Jc (at 77 K) of the above samples were measured. Results are summarized in Table 3.

TABLE 3

|  | Areal reduction (%) | Tc (K) | Jc (A/cm$^2$) |
| --- | --- | --- | --- |
| Example 5 | 99 | 92 | 4,800 |
| Example 6 | 99 | 92 | 21,900 |
| Example 7 | 99 | 92 | 35,000 |
| Example 8 | 99.96 | 92 | 6,500 |
| Example 9 | 99.96 | 92 | 39,000 |
| Comparative Example 5 | 99.96 | less than 4.2 | 0 |
| Comparative Example 6 | 99.96 | less than 4.2 | 0 |
| Comparative Example 7 | 99.96 | less than 4.2 | 0 |
| Comparative Example 8 | 99.96 | less than 4.2 | 0 |
| Comparative Example 9 | 99.96 | less than 4.2 | 0 |

As is apparent from Table 3, the samples of Examples 5 to 9 exhibit excellent superconducting characteristics as compared with the samples of Comparative Examples 5 to 9. From the comparison between Examples 1 and 2 and Examples 5 and 8, an areal reduction greatly influences an increase in Jc. An effect derived from the orientation treatment of the present invention is apparent from the samples in Examples 6, 7, and 9. The excellent characteristics of these samples exhibit the synergistic effect of working and orientation.

EXAMPLE 10

A sintered body (density: 81%) of $BiSrCaCu_2O_x$ was filled in metal container 1 (SUS310 vessel with 20-$\mu$ thick Ag lining on the inner wall surface; thickness of metal wall: 1.0 mm; thickness of container portion: 6 mm; width of container portion: 20 mm) shown in FIG. 1. Deaeration was performed and an opening was sealed. This was pressed at 800° C. and 1 ton/cm$^2$ for an hour following the same procedures as in Example 4 to prepare a pressed body having a thickness of 4.0 mm. The pressed body was rolled to a thickness of 0.5 mm and slit at a pitch of 2 mm. The resultant sample was treated in air at 750° C. for 24 hours.

COMPARATIVE EXAMPLE 10

A sample was prepared following the same procedures as in Example 10 except that the sample was not slit.

Critical temperatures Tc and critical current densities Jc (at 77 K) of the samples of Example 10 and Comparative Example 10 were measured. Results are summarized in Table 4.

TABLE 4

|  | Areal reduction (%) | Tc (K) | Jc (A/cm$^2$) |
| --- | --- | --- | --- |
| Example 10 | 92 | 82 | 690 |
| Comparative Example 10 | 92 | 21 | 0 |

According to the method of the present invention, even the ceramic superconductor having poor workability can be efficiently worked into wire and strip, thereby obtaining a continuous wire or strip having excellent superconducting characteristics. These materials can exhibit superconducting characteristics at a liquid nitrogen temperature and further possible room temperature, which are much higher than the conventional liquid He temperature, thus providing great industrial advantages.

In addition to the oxides described above, the present invention is apparently applicable to ceramic superconductors having a Chevrel phase ($PbMo_6S_8$, $SnMo_6S_8$, etc.).

What is claimed is:

1. A method of manufacturing a superconductor, comprising the steps of:
    filling a ceramic superconductive material into a metal container;
    elongating the metal container after sealing said ceramic superconductive material therein, thereby forming an elongated mass of said ceramic superconductive material;
    slitting the elongated metal container with at least two elongated slits in the longitudinal direction of the elongated metal container after said elongating step, said at least two slits each being continuous over the entire length of the elongated metal container and having a predetermined spacing therebetween thereby producing at least one slit section of the filled elongated metal container of given width, thereby separating the at least one slit section of the elongated metal container from a remainder of the elongated metal container, thereby partially exposing the ceramic superconductive material inside the at least one slit section along substantially the entire length thereof, to an outside atmosphere;
    sintering the ceramic superconductive material inside the at least one slit section of the elongated metal container after said slitting step while reacting the exposed superconductive material with oxygen in said outside atmosphere, thereby forming a sintered elongated mass.

2. The method according to claim 1, wherein the metal container comprises a metal block having a plurality of hollow tube portions.

3. The method according to claim 2, further comprising the steps of filling a plurality of said elongated masses in a further metal container, and working the resulting mass into a wire.

4. The method according to claim 1, wherein the step of elongating the metal container comprises the step of rolling the metal container, thereby obtaining a wide metal strip, and the step of slitting the metal container comprises the step of forming more than two slits in the wide metal strip.

5. The method according to claim 1, comprising using a crystalline material as the ceramic superconductive material.

6. The method according to claim 5, wherein the crystalline material is a polycrystalline material.

7. A method according to claim 5, wherein the crystalline material is a monocrystalline material.

8. The method according to claim 1, further comprising the steps of:
    heating the metal container to at least a temperature not less than a melting point of the superconductive material after the superconductive material is filled in the metal container, thereby melting said superconductive material inside the metal container; and
    then cooling and solidifying the molten superconductive material inside the metal container while giving a temperature gradient in an elongation direction prior to said slitting step.

9. The method according to claim 8, comprising performing the step of solidifying the molten superconductive material during the step of elongating the metal container.

10. The method according to claim 8, comprising performing the step of solidifying the molten superconductive material after the step of elongating the metal container.

11. The method according to claim 1, wherein the step of elongating the metal container comprises the step of elongating the metal container at least partially at a high temperature falling within a range of a melting point of the superconductive material and a temperature lower than that by 300° C.

12. The method according to claim 1, further comprising the steps of filling a plurality of said elongated masses in a further metal container, and working the resulting mass into a wire.

13. A method of manufacturing a superconductor, comprising the steps of:
    filling a material mixture of a ceramic superconductive material into a metal container;

elongating the metal container after sealing said material mixture therein, thereby forming an elongated mass of said material mixture;

slitting the elongated metal container with at least two elongated slits in the longitudinal direction of the elongated metal container after said elongating step, said at least two silts each being continuous over the entire length of the elongated metal container and having a predetermined spacing therebetween, thereby producing at least one slit section of the filled elongated metal container of given width, thereby separating the at least one slit section of the elongated metal container from a remainder of the elongated metal container, thereby partially exposing the material mixture inside the at least one slit section along substantially the entire length thereof, to an outside atmosphere; and sintering the material mixture inside the at least one slit section of the elongated metal container after said slitting step while reacting the exposed material mixture with oxygen in said outside atmosphere, thereby forming a sintered elongated mass.

14. The method according to claim 13, including forming the metal container as a metal block having a plurality of hollow tube portions.

15. The method according to claim 14, further comprising the steps of filling a plurality of said elongated masses in a further metal container, and working the resulting mass into a metal.

16. The method according to claim 13, wherein the step of elongating the metal container comprises the step of rolling the metal container, thereby obtaining a wide metal strip, and the step of slitting the metal container comprises the step of forming more than two slits in the wide metal strip.

17. The method according to claim 13, comprising using a crystalline material as part of the material mixture.

18. The method according to claim 17, wherein the crystalline material is a polycrystalline material.

19. The method according to claim 17, wherein the crystalline material is a monocrystalline material.

20. The method according to claim 13, further comprising the steps of:

heating the metal container to at least a temperature not less than a melting point of the material mixture after the mixture is filled in the metal container, thereby melting the material mixture inside the metal container; and then cooling and solidifying the molten material mixture inside the metal container while a temperature gradient is given in an elongation direction prior to said slitting step.

21. The method according to claim 20, comprising performing the step of solidifying the material mixture during the step of elongating the metal container.

22. The method according to claim 20, comprising performing the step of solidifying the material mixture after the step of elongating the metal container.

23. The method according to claim 13, wherein the step of elongating the metal container comprises the step of elongating the metal container at least partially at a high temperature falling within a range of a melting point of the material mixture and a temperature lower than that by 300° C.

24. The method according to claim 13, further comprising the steps of filling a plurality of said elongated masses in a further metal container, and working the resulting mass into a wire.

* * * * *